United States Patent [19]
Canella et al.

[11] Patent Number: 6,089,107
[45] Date of Patent: Jul. 18, 2000

[54] PROCESS FOR TESTING A SEMICONDUCTOR DEVICE

[75] Inventors: Robert L. Canella, Meridian; Warren M. Farnworth, Nampa, both of Id.

[73] Assignee: Micron Electronics, Inc., Nampa, Id.

[21] Appl. No.: 08/893,007

[22] Filed: Jul. 15, 1997

Related U.S. Application Data

[62] Division of application No. 08/636,449, Apr. 23, 1996, Pat. No. 5,648,728, which is a continuation of application No. 08/205,678, Mar. 1, 1994, Pat. No. 5,510,723.

[51] Int. Cl.[7] .................................................. G01R 31/02
[52] U.S. Cl. ........................................................ 73/865.8
[58] Field of Search .......................... 73/865.8; 324/754, 324/758, 761, 762, 765; 269/21, 55–58, 289 R; 248/346.01, 362; 348/87, 94, 95

[56] References Cited

U.S. PATENT DOCUMENTS

| | | | |
|---|---|---|---|
| 3,863,764 | 2/1975 | Myslinski et al. | 209/111.8 |
| 4,410,168 | 10/1983 | Gotman . | |
| 4,775,281 | 10/1988 | Prentakis | 414/416 |
| 4,903,717 | 2/1990 | Sumnitsch . | |
| 4,934,064 | 6/1990 | Yamaguchi et al. | 324/758 |
| 4,980,636 | 12/1990 | Romanofsky et al. | 324/754 |
| 5,321,352 | 6/1994 | Takebuchi | 324/758 |
| 5,436,568 | 7/1995 | Woith | 324/758 |
| 5,670,888 | 9/1997 | Cheng | 324/758 |

*Primary Examiner*—Robert Raevis
*Attorney, Agent, or Firm*—Trop, Pruner & Hu, P.C.

[57] ABSTRACT

A method for positioning a workpiece comprises the steps of providing a pedestal having a chamfered portion and a generally circular portion having a first diameter and providing a table having a hole therein and a chamfered portion, the hole having a second diameter larger than the first diameter. The inventive method further includes the steps of supporting the pedestal with the table, the chamfered portion of the table contacting the chamfered portion of the pedestal and placing the workpiece on the pedestal. Next, the chamfered portion of the pedestal is urged away from the table. Subsequent to the step of urging the chamfered portion of the pedestal away from the table, the pedestal is moved in at least one of X-, Y-, and theta directions while the generally circular portion of the pedestal extends into the hole in the table.

18 Claims, 2 Drawing Sheets

PROCESS FOR TESTING A SEMICONDUCTOR DEVICE

This is a division of application Ser. No. 08/636,449 filed Apr. 23, 1996 and issued Jul. 15, 1997 as U.S. Pat. No. 5,648,728, which is a continuation of application Ser. No. 08/205,678 filed Mar. 1, 1994, issued Apr. 23, 1996 as U.S. Pat. No. 5,510,723.

FIELD OF THE INVENTION

This invention relates to the field of semiconductor device manufacturing. More specifically, an apparatus for transporting and testing an unpackaged semiconductor device is described.

BACKGROUND OF THE INVENTION

Many types of semiconductor devices are made using similar manufacturing procedures. A starting substrate, usually a thin wafer of silicon, is doped, masked, and etched through several process steps, the steps depending on the type of devices being manufactured. This process yields a number of semiconductor devices (dies) on each wafer produced. Each die on the wafer is given a brief test for functionality, and the nonfunctional devices are mechanically marked or mapped in software. This probe test is only a gross measure of functionality, and does not insure that a device is completely functional or has specifications that would warrant its assembly in a package.

If the wafer has a yield of grossly functional devices which indicates that a significant number of devices from the wafer are likely to be fully operative, the devices are separated with a die saw (diced) into discrete devices, and the nonfunctional devices are scrapped while the functioning devices are individually encapsulated in plastic packages or mounted in ceramic packages with one device in each package. After the diced devices are packaged they are rigorously electrically tested. Components which become nonfunctional or which operate below full industry specifications are scrapped or devoted to special uses.

Packaging unusable devices only to scrap them after testing is costly. Given the relatively low profit margins of commodity semiconductor components such as dynamic random access memories (DRAMs) and static random access memories (SRAMs), this practice is uneconomical. However, no thorough, cost effective, and automated method of testing an unpackaged device is available which would prevent this unnecessary packaging of nonfunctional and marginally functional devices.

It is becoming more common to package multiple integrated circuit devices as a single unit, known as a multi chip module (MCM). Testing of each device before it is assembled into the MCM is difficult because the conventional lead frame package is not typically used for the manufacture of MCMs. The reliability of the entire package is compromised by the individual component with the least performance capability. Although there is no industry standard by which devices are tested and considered "known good die," it is desirable to have the ability to retest the individual die being used on a particular MCM to increase the potential for greater yields. The ability to presort an individual device is limited to results obtained through probe testing, which is only a gross measure of functionality and does not typically result in information regarding access times or reliability. An MCM is burned in after assembly, which can result in the failure of one or more DRAMs. If a single device is nonfunctional or operates outside of acceptable specifications, the entire component fails and all devices in the package are scrapped or an attempt is made to "re-work" the MCM. There is presently no cost-effective way to reclaim the functioning devices.

Statistically, the yields of MCMs decrease in proportion to the increasing number of devices in each module. The highest density modules have the lowest yields due to their increased total silicon surface area. Testing of unpackaged devices before packaging would be desirable as it would result in reduced material waste, increased profits, and increased throughput. Using only known good devices in multichip modules would increase yields significantly. An apparatus which allows for the handling and testing of an unpackaged semiconductor device would be desirable. Similarly, an apparatus which would allow a user of diced devices purchased from a manufacturer to test incoming devices would be desirable.

SUMMARY OF THE INVENTION

An automated apparatus for testing an unencapsulated diced semiconductor device comprises a test head. The test head comprises a carousel table having a top and a bottom. A carousel table portion (which can be the carousel table itself or an insert in the carousel table) has a chamfered portion. The test head further comprises a chamfered pedestal received by the chamfered portion of the carousel table. The pedestal has a bottom portion which extends through the carousel table below the carousel table bottom. The semiconductor device to be tested is received by the pedestal.

The test head also has a chuck for receiving the bottom portion of the pedestal. The chuck is moveable in four directions, the X, Y, Z, and theta directions. A probe is positioned above the pedestal for the passage of an electric signal to the semiconductor device. The apparatus further comprises a camera for detecting a position of said probe relative to a position of the semiconductor device.

In operation, the chuck receives the bottom portion of the pedestal and urges the pedestal from the chamfered portion of the carousel table toward the probes. The chuck moves in the X, Y, and theta directions responsive to a signal from the camera to align the semiconductor device with the probes. The probes then make contact with the diced semiconductor device on the pedestal.

Objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
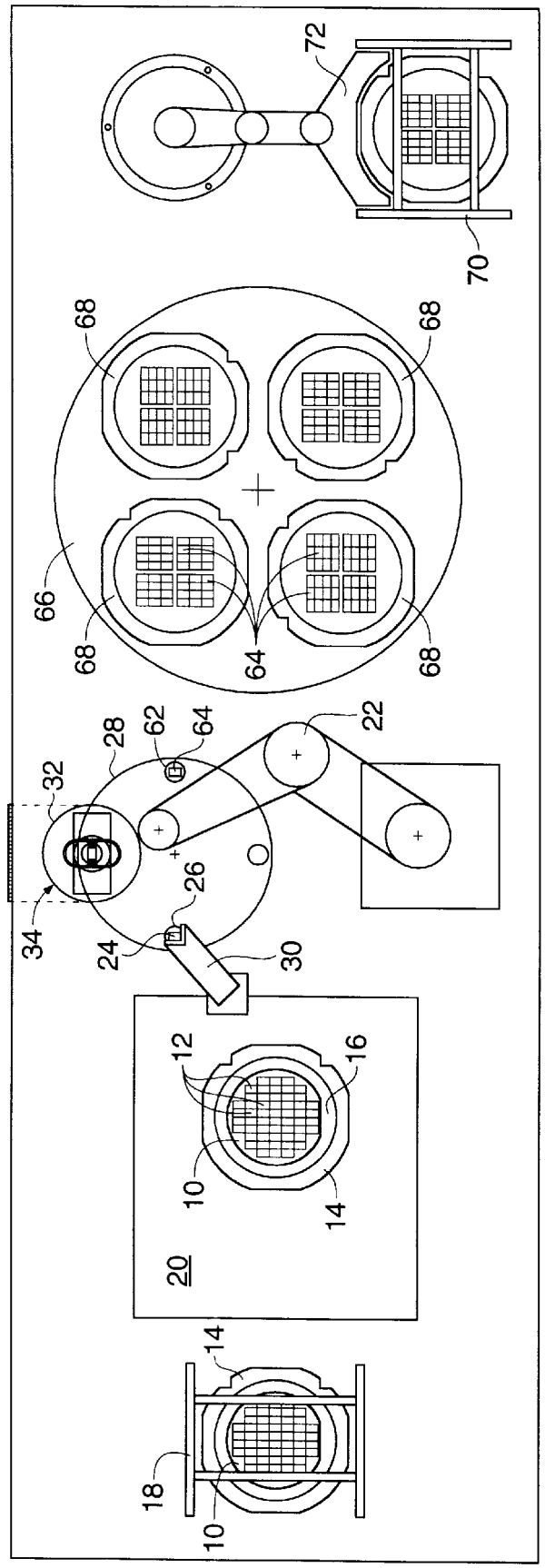
FIG. 1 is a plan view of one embodiment of the invention.

FIG. 1 is a plan view of one embodiment of the invention. The flow of a diced device though the assembly as shown in FIG. 1 is generally from left to right.

Prior to testing the device with the inventive assembly, a semiconductor wafer 10 is produced according to means known in the art. The plurality of devices 12 on the wafer 10 are diced, typically with a wafer saw, and remain attached to a carrier ring by an adhesive carrier film 16. A number of carrier rings 14 including wafers 16 are stored in a wafer boat 18 for storage and for transportation to the test assembly.

An individual wafer carrier 14, or a boat 18 of wafers as shown in FIG. 1, is placed in proximity to the inventive assembly. A single wafer carrier 14 is staged, for example on a module 20 which coarsely positions the wafer 10 in the X and Y directions. A module 20 such as that produced by European Semiconductor Equipment Corporation (ESEC) of Phoenix, AZ would function sufficiently, and other means for staging a wafer of semiconductor devices would be possible and likely. A module such as the ESEC module includes an assembly (not shown) for removing the carrier from the boat and loading it onto the module platform. The positioning of the carrier on the module platform can be performed, for example, with the aid of a camera (not shown), such as that available from Cognex Corp. of Needham, Mass. The positioning of the camera and movement of the module from information supplied by the camera can be determined by one of skill in the art from the information herein.

After the wafer carrier 14 is positioned on the module 20, each diced device 12 (or those found to be functioning during a probe test) is removed from the carrier 14. With the ESEC module, removal pins (not shown) push up against the film 16 which attaches the device 12 to the carrier 14 and pushes the back of the device and removes the device from the film. Simultaneously, a robot arm 22 picks up the device to be tested 24, for example with a vacuum, and transports the device 24 to location one 26 on a test carousel 28. A robot such as a model 550 from Adept Technology, Inc. of San Jose, Calif., a Model 6100 available from Cybeq of Menlo Park, Calif. or a number of other similar functioning serial communication articulated robotic arm (SCARA) or gantry type robots, would function sufficiently. A mechanical precisor 30 as shown, which provides for theta alignment of the device 24, is an alternate embodiment which may have advantages. This may also be accomplished with theta alignment by the robot arm. If a precisor is used, the precisor 30 moves the device 24 to a known position on location one 26 of the test carousel 28.

After the diced device is placed on location one of the test carousel, the carousel rotates to position the device at location two 32 which is the test location. In FIG. 1 the carousel rotates 90° to position the device at the test head 34, although other possibilities are likely.

Figure 2:
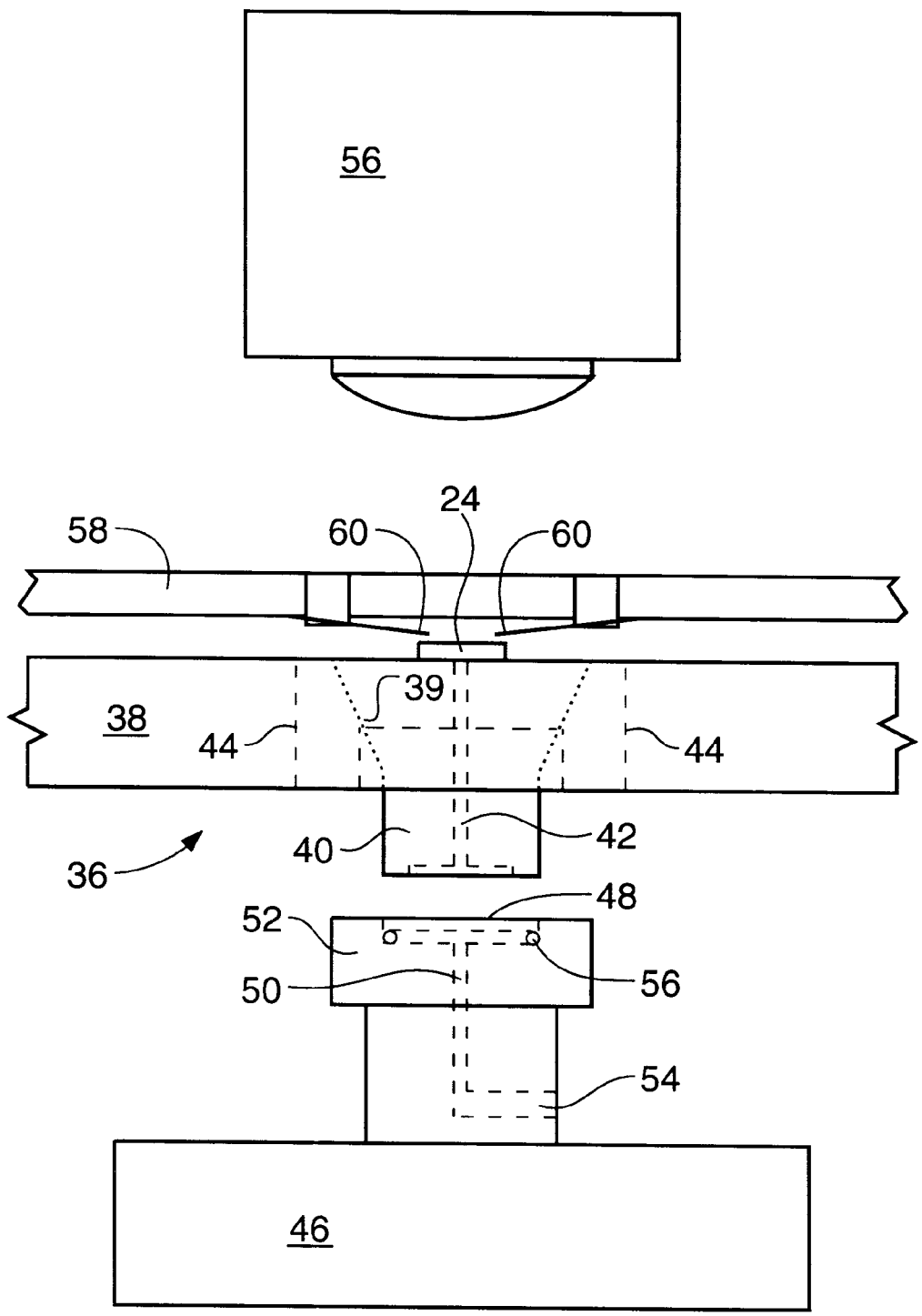
FIG. 2 is a cross-section showing a test head assembly of FIG. 1.

FIG. 2 is a cross section of the test head assembly 34 of location two 32. The device test carousel 36 comprises a carousel table 38 having a chamfered portion and a moveable chamfered test pedestal 40 with a hole 42 for vacuum therethrough. The chamfered portion of the pedestal rests on the chamfered portion of the carousel table. An alternate embodiment which has a hardened chamfered insert 44 in the carousel table 38 as shown for receiving the test pedestal 40 may improve the manufacturability of the carousel table 38. In any case, an X-Y-Z-theta table 46 is positioned below the carousel table 38, and comprises a chuck 48 having a port 50 for creating a vacuum and a base 52. In one embodiment the base can be magnetic to facilitate coupling with the test pedestal 40. In the embodiment shown the chuck 48 and the pedestal 40 have a space therebetween to allow for rotation of the carousel during transportation of the device. Other means for handling the chuck are possible.

In operation, after the device 24 is moved from location one to location two by rotation of the carousel 36 about an axis, the X-Y-Z-theta table 46 moves in the Z direction (vertically) and the chuck 48 contacts the test pedestal 40. The hole 42 in the pedestal 40 and the hole 50 in the chuck 48 mate, and a vacuum is imparted to a vacuum port 54 by means known in the art. The vacuum holds the device 24 into semirigid contact with the pedestal 40. A depression or cavity on the pedestal can also be provided to nest the device under test. An "O" ring 56 in the chuck 48 reduces the loss of the vacuum to the device 24, although other means for reducing the vacuum loss are possible. Heated and cooled chucks, such as those available from Temptronics Corp. of Newton, Mass. may be used to test the device at temperatures other than ambient.

After the chuck 48 contacts the pedestal 40 and the vacuum is imparted to the device 24, the X-Y-Z-theta table 46 continues to rise, which lifts the chamfered pedestal 40 from the chamfered portion 39 of the carousel table 38 As the base of the pedestal is smaller than the hole through the bottom of the hardened insert 44 (or through the table if an insert is not used), the pedestal 40 is allowed some movement in the X- and Y- directions. A camera 56 (such as the Cognex as described above or some other workable camera) positioned near a test mechanism 58 detects the position of a probe or probes 60 on the test mechanism 58 relative to a position of the device 24 by movement of the X-Y-Z-theta table. The camera, therefore, can view both the die and the probes. By detecting the position of the die, the position of contacts on the die (such as bond pads, not show) can be determined, or the contacts can be viewed directly and would provide equivalent results. A test mechanism 60 such as a probe card or other means which allows for the passage of an electrical signal between contacts on the device and the test mechanism would function sufficiently. Probe cards which would function for this purpose are available from several sources, such as Micro-Probe. Inc. of San Diego, Calif. As the X-Y-Z-theta table (and thus the device) is raised, output from the camera allows a computer to coordinate movement of the X-Y-Z-theta table in the X-, Y-, and theta- directions to align the contacts on the device with the probes on the test mechanism. A model 1000 series available from Nutec Components of Deer Park, N.Y., or others, can provide X-Y-theta alignment, and the Z-element can be provided, for example, by Aerotec of Pittsburgh, Pa.

The device is raised in the Z-direction until the probes 60 make controlled contact with the bond pads (not shown) on the device 24. A force of three to five grams per bond pad would be sufficient to allow the probe contacts 60 to make electrical connection with the bond pads. Additional forces can be applied as determined by the surface area of the contact and the geometry (i.e. spherical or flat) of the probe. The force can be measured by a GS-series pressure transducer available from Transducer Techniques of Rancho California, Calif. or other workable means. Once the probes 60 on the test mechanism 58 contact the contacts (not shown) on the device 24, the circuitry on the device is tested by means known in the art, by connection of the probe card with a tester such as a model Q2 tester from MegaTest Corporation of San Jose, Calif. After the device is tested the X-Y-Z-theta table is lowered so the pedestal 40 returns to the carousel table 38. The X-Y-Z-theta table is further lowered so the chuck 48 clears the pedestal 40, and the carousel 36 is rotated to position the tested device 24 at location three of FIG. 1.

The tested device 64 is moved by the robot 22 (or by a different similar robot) to a sort carousel 66. The sort carousel receives the tested device. The placement of a tested device on the sort carousel can take any number of configurations. For example, a diced device can be placed on one of four carrier rings 68 as shown in FIG. 1, with each carrier ring being designated for devices having similar test performance characteristics (a total of four sort bins). It is further possible for a number of different arrays on each of the carrier rings to represent a different sort bin (16 bins shown in FIG. 1, with four sort bins on each carrier ring). Also, the carrier rings can be filled with tested device sequentially with the test results being mapped in software for later sorting. Means for storage other than carrier rings, and the configurations other than those described, are possible and likely.

Once the carrier rings 68 (or other storage means) are filled with tested devices 64 as desired, they are moved from the sort carousel 66 to a storage location, for example a boat 70, for later removal from the carrier ring. A robot 72 such as a model ATM 100 series manufactured by Equipe Technologies of Mountain View, Calif. would function sufficiently to move a carrier ring 68 from the sort carousel 66 to the storage boat 70.

In another embodiment, a probe card can be used which does not have an access hole for viewing both the probes and the contacts on the die. In this embodiment, a prism is used to focus light reflected from the probe and contacts into the camera. The X-Y-Z-theta table moves responsive to signals from the camera to align the contacts (such as bond pads) with the probes on the probe card. Reference marks on the probe card and the pedestal may also be used to align the probe with the contacts on the die.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, it may be possible to have more than one test head on the test carousel. It is therefore contemplated that the appended claims will cover any such modifications or embodiments as fall within the true scope of the invention.

What is claimed is:

1. A process for transporting and testing an unpackaged semiconductor device comprising the following steps:

staging a semiconductor wafer having a plurality of semiconductor devices thereupon;

moving one of said semiconductor devices onto a chamfered pedestal of a carousel table, said carousel table having a chamfered portion, said chamfered pedestal resting against said chamfered portion of said carousel table;

positioning said semiconductor device at a test head;

lifting said pedestal from said carousel table toward a probe;

responsive to a signal from a camera, moving said pedestal in at least one of an X-, Y-, and theta direction to align said semiconductor device with said probe;

contacting said probe and said semiconductor device thereby making electrical contact between said semiconductor device and said probe; and testing said semiconductor device by passing an electrical signal through said probe to said semiconductor device.

2. The process of claim 1 wherein said pedestal has a hole therethrough, said process further comprising imparting a vacuum through said hole in said pedestal to said semiconductor device thereby holding said semiconductor device in semirigid contact with said pedestal.

3. The process of claim 1 further comprising the step of heating said pedestal to raise the temperature of said semiconductor device prior to said testing step.

4. The process of claim 1 wherein said positioning step comprises rotating said carousel table about an axis.

5. The process of claim 1 further comprising:

rotating said carousel table subsequent to said testing step;

removing said semiconductor device form said pedestal; and placing said semiconductor device on an adhesive film of a carrier ring.

6. The process of claim 5 further comprising the step of placing said semiconductor device on said adhesive film in accordance with performance characteristics determined during said testing step.

7. A process used during the manufacture of a semiconductor device comprising the following steps:

providing a semiconductor device;

providing a pedestal supported by a table wherein said pedestal rests on said table, said table including a hole therein and an insert received by said hole;

resting said pedestal on said insert of said table;

placing said semiconductor device such that said pedestal supports said semiconductor device;

urging said pedestal away from said table; and moving said pedestal relative to said table to position said semiconductor device.

8. The process of claim 7 wherein the step of moving said pedestal includes extending a portion of the pedestal into said hole.

9. The process of claim 8 wherein said table and said pedestal each comprise a chamfered portion and said step of providing said pedestal includes contacting said chamfered portion of said table with said chamfered portion of said pedestal as said pedestal rests on said table.

10. The process of claim 8 wherein said step of moving said pedestal further comprises moving said pedestal in at least one of X-, Y-, and theta directions.

11. The process of claim 7 further comprising the step of contacting said semiconductor device with a test apparatus during said step of urging said pedestal away from said table.

12. The process of claim 7 wherein said pedestal and said insert further comprise chamfered portions wherein said step of providing said pedestal includes contacting said chamfered portion of said pedestal with said chamfered portion of said insert.

13. The process of claim 7 wherein said step of providing said semiconductor device includes providing an unpackaged semiconductor wafer section.

14. The process of claim 7 wherein said step of moving said pedestal is performed responsive to data from an optical input device, said step further comprising;

contacting said semiconductor device with a test apparatus: and and testing said semiconductor device.

15. A method for positioning a workpiece comprising the following steps:

providing a pedestal having a chamfered portion and a generally circular portion having a first diameter;

providing a table having a hole therein and a chamfered portion, said hole having a second diameter larger than said first diameter;

supporting said pedestal with said table, said chamfered portion of said table contacting said chamfered portion of said pedestal;

placing said workpiece on said pedestal;

urging said chamfered portion of said pedestal away from said table; and subsequent to said step of urging said chamfered portion of said pedestal away from said table, moving said pedestal in at least one of X-, Y-, and theta directions while said generally circular portion of said pedestal extends into said hole in said table.

16. The process of claim 15 further comprising the step of contacting said pedestal with a base which urges said chamfered portion of said pedestal away from said table.

17. The process of claim 15 further comprising the step of rotating said table subsequent to said step of placing said workpiece on said pedestal and prior to said step of urging said chamfered portion of said pedestal away from said table.

18. The process of claim 17 wherein said step of providing said table includes providing a table comprising at least four holes therein wherein each said hole receives a different chamfered pedestal therein.

* * * * *